United States Patent
Ramaswamy et al.

(10) Patent No.: US 8,629,421 B1
(45) Date of Patent: Jan. 14, 2014

(54) MEMORY CELLS

(71) Applicant: Micron Technology, Inc., Boise, ID (US)

(72) Inventors: D.V. Nirmal Ramaswamy, Boise, ID (US); Murali Balakrishnan, Boise, ID (US); Alessandro Torsi, Boise, ID (US); Noel Rocklein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/652,286

(22) Filed: Oct. 15, 2012

(51) Int. Cl.
*H01L 29/02* (2006.01)

(52) U.S. Cl.
USPC ...... 257/4; 257/2; 257/3; 257/5; 257/E29.002; 438/102; 438/103; 438/104

(58) Field of Classification Search
USPC ............. 257/2–5, E29.002; 438/102–104; 365/163
See application file for complete search history.

(56) References Cited

U.S. PATENT DOCUMENTS

| | | |
|---|---|---|
| 7,894,239 B2 | 2/2011 | Tamai et al. |
| 8,134,865 B2 | 3/2012 | Chang et al. |
| 2010/0021626 A1 | 1/2010 | Hsieh et al. |
| 2011/0140067 A1 | 6/2011 | Chen et al. |
| 2012/0069626 A1 | 3/2012 | Nakano et al. |
| 2012/0273747 A1* | 11/2012 | Saitoh et al. ............ 257/5 |

FOREIGN PATENT DOCUMENTS

CN 102130297 A 7/2011

OTHER PUBLICATIONS

Wang et al., "HfOx-Based RRAM Cells with Fully CMOS Compatible Technology," 2012 International Conference on Solid-State and Integrated Circuit, IPCSIT vol. 32(2012), Singapore.

* cited by examiner

*Primary Examiner* — Jami M Valentine
(74) *Attorney, Agent, or Firm* — Wells St. John P.S.

(57) ABSTRACT

Some embodiments include memory cells having programmable material between a pair of electrodes. The programmable material includes a material selected from the group consisting of a metal silicate with a ratio of metal to silicon within a range of from about 2 to about 6, and metal aluminate with a ratio of metal to aluminum within a range of from about 2 to about 6. Some embodiments include methods of forming memory cells. First electrode material is formed. Programmable material is formed over the first electrode material, with the programmable material including metal silicate and/or metal aluminate. Second electrode material is formed over the programmable material, and then an anneal is conducted at a temperature within a range of from about 300° C. to about 500° C. for a time of from about 1 minute to about 1 hour.

17 Claims, 3 Drawing Sheets

MEMORY CELLS

TECHNICAL FIELD

Memory cells and methods of forming memory cells.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

There is a continuing effort to produce smaller and denser integrated circuits. The smallest and simplest memory cell will likely be comprised of two electrically conductive electrodes having a programmable material received between them. The programmable material has two or more selectable and electrically differentiable memory states, which enables storing of information by an individual memory cell. The reading of the cell comprises determination of which of the memory states the programmable material is in, and the writing of information to the cell comprises placing the programmable material in a predetermined memory state. Memory devices that utilize changes in resistivity across programmable material to transition from one memory state to another are sometimes referred to as Resistive Random Access Memory (RRAM) cells.

There is a continuing goal to improve performance characteristics of memory cells, and a continuing goal to improve yield of memory cells from fabrication processes. It would therefore be desirable to develop new memory cells, and to develop new methods of forming memory cells.

DETAILED DESCRIPTION OF THE ILLUSTRATED EMBODIMENTS

Some embodiments include memory cells containing programmable material which includes metal silicate and/or metal aluminate; and some embodiments include methods of making such memory cells. Example embodiments are described with reference to FIGS. 1-11.

Figure 1:
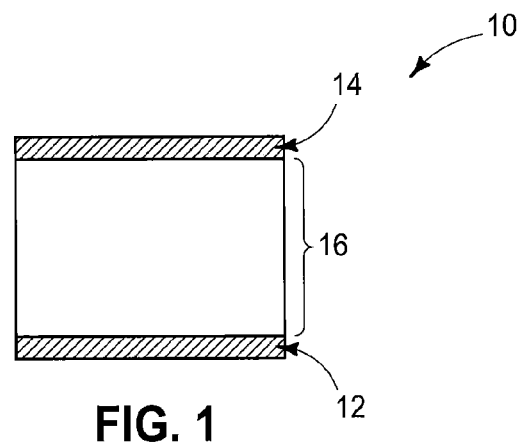
FIGS. 1, 3, 4, 6 and 7 are diagrammatic cross-sectional views of example embodiment memory cells.

Referring to FIG. 1, an example embodiment memory cell 10 is illustrated. Such memory cell includes a first electrode 12, a second electrode 14, and a programmable material 16 between the first and second electrodes.

The first and second electrodes may comprise any suitable compositions or combinations of compositions. In some embodiments, the first electrode 12 will comprise, consist essentially of, or consist of a metal selected from the group consisting of hafnium, lanthanum, ruthenium, titanium, zirconium and mixtures thereof. In such embodiments, the first electrode may be referred to as a reactive electrode, in that the metals of such electrode may be suitable for reacting with the programmable material during formation and/or operation of the memory cell.

In some embodiments, the second electrode 14 may consist of a composition which is non-reactive relative to the composition of the programmable material; and may, for example, comprise, consist essentially of, or consist of one or more of hafnium nitride, lanthanum nitride, ruthenium nitride, titanium nitride and zirconium nitride.

In some example embodiments, the first electrode 12 will comprise, consist essentially of, or consist of a metal selected from the group consisting of hafnium, lanthanum, ruthenium, titanium, zirconium and mixtures thereof; and the second electrode 14 will comprise, consist essentially of or consist of a metal nitride comprising the metal of the first electrode. For instance, in some embodiments the first electrode 12 may comprise titanium while the second electrode 14 comprises titanium nitride.

The programmable material 16 may comprise, consist essentially, or consist of one or both of metal silicate and metal aluminate. The metal silicate may be selected from the group consisting of hafnium silicate, lanthanum silicate, ruthenium silicate, titanium silicate, zirconium silicate, and mixtures thereof; and the metal aluminate may be selected from the group consisting of hafnium aluminate, lanthanum aluminate, ruthenium aluminate, titanium aluminate, zirconium aluminate and mixtures thereof.

In some embodiments, the programmable material comprises a region which includes a composition selected from the group consisting of a metal silicate with a ratio of metal to silicon within a range of from about 2 to about 6, and a metal aluminate with a ratio of metal to aluminum with a range of from about 2 to about 6. Utilization of such compositions within programmable materials of RRAM cells is found to improve yield of functional cells during a fabrication process relative to processes forming analogous cells lacking such compositions of metal silicate and/or metal aluminate, and to improve durability of the RRAM cells relative to cells lacking such compositions of metal silicate and/or metal aluminate. Thus, inclusion of one or both of metal silicate with a ratio of metal to silicon within a range of from about 2 to about 6, and metal aluminate with a ratio of metal to aluminum within a range of from about 2 to about 6 in RRAM cells may improve yield and performance of the cells relative to conventional RRAM cells. In some embodiments, the utilization of metal silicate having a ratio of metal to silicon within the range of from about 2 to about 6 and/or metal aluminate having a ratio of metal to aluminum within the range of from about 2 to about 6 is found to improve low current operation of memory cells and reset characteristics of memory cells.

In some embodiments, the programmable material 16 may be a single homogeneous composition extending from directly against the first electrode to directly against the second electrode. In some embodiments, the programmable material 16 may comprise a concentration gradient of metal within one or both of metal aluminate and metal silicate. For instance, the programmable material may comprise a first composition adjacent the first electrode 12, and a second composition adjacent the second electrode 14. The first composition may comprise the metal silicate with a ratio of metal to silicon within a range of from about 2 to about 6, and/or the metal aluminate with a ratio of metal to aluminum within a range of from about 2 to about 6; and the second composition may comprise metal silicate having a ratio of metal to silicon of at least about 8 and/or metal aluminate having a ratio of metal to aluminum of at least about 8. In such embodiments, the first composition may be directly against a reactive electrode, the second composition may be directly against a nonreactive electrode, and the programmable material may have a concentration gradient of metal which extends from the first composition to the second composition such that the concentration of metal increases across the programmable material along a direction from the reactive electrode to the nonreactive electrode.

In a specific example embodiment, the reactive electrode may consist essentially of titanium, the nonreactive electrode may comprise titanium nitride, and the programmable material may consist essentially of hafnium silicate. A region of the programmable material directly against the reactive electrode may have a ratio of hafnium to silicon within a range of from about 3 to about 6, a region of the programmable material directly against the nonreactive electrode may have a ratio of hafnium to silicon of at least about 8, and the programmable material may comprise a concentration gradient of hafnium which increases along a direction from the reactive electrode to the nonreactive electrode. The region adjacent the nonreactive electrode has a higher dielectric constant than the region adjacent the reactive electrode (i.e., may be considered to have a higher ratio of hafnium oxide relative to silicate), which may improve yield and/or device performance in some embodiments. The concentration gradient may be any suitable gradient, including, for example, a linear gradient or a stepped gradient.

Although the reactive electrode and the nonreactive electrode are described to be the electrodes below and above the programmable material 16, respectively, in the embodiment of FIG. 1; in other embodiments the relative positions of the reactive and nonreactive electrodes may be reversed so that the reactive electrode is above programmable material 16 and the nonreactive electrode is below such programmable material. Similarly, any of the other embodiments described herein may be constructed with an illustrated arrangement of electrodes, or with an opposite arrangement in which the electrodes (and possibly one or more regions between the electrodes) are reversed relative to the illustrated arrangement.

Figure 2:
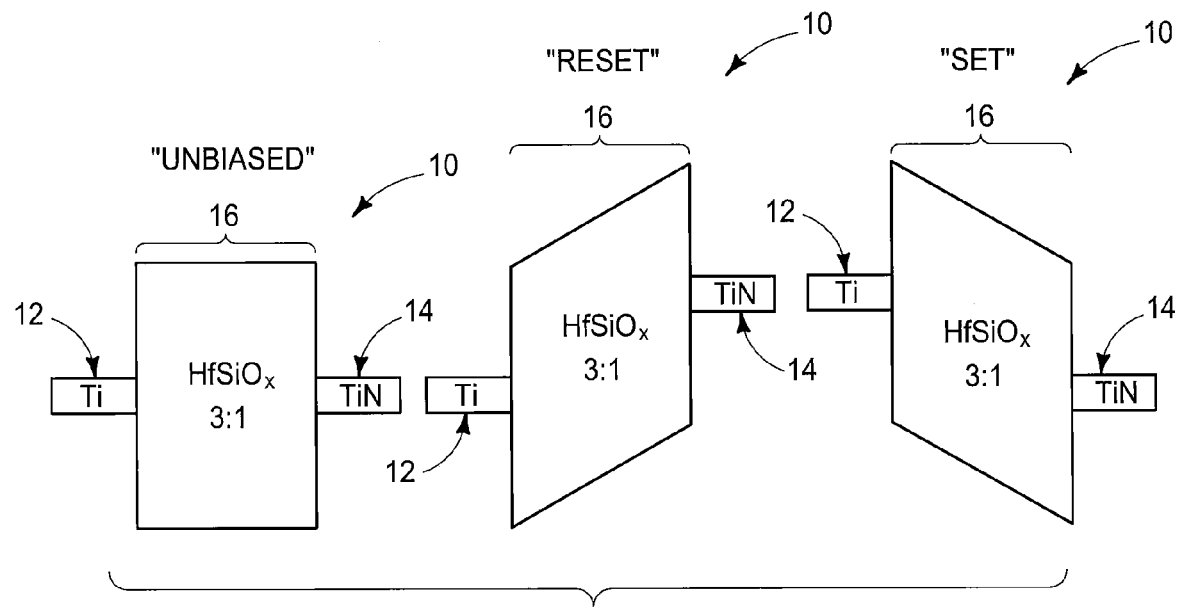
FIG. 2 illustrates example operational states of an example memory cell of the type shown in FIG. 1, utilizing band gap diagrams.

FIG. 2 diagrammatically illustrates a plurality of operational states (a so-called "UNBIASED" state, "RESET" state, and "SET" state) utilizing band gap diagrams. The example embodiment comprises a first electrode 12 consisting of titanium, a second electrode 14 consisting of titanium nitride, and programmable material 16 consisting of hafnium silicate with the ratio of hafnium to silicon being about 3:1.

The "RESET" and "SET" states have different resistivities relative to one another, and correspond to different memory states of the memory cell 10. Operation of memory cell 10 comprises programming the memory cell to place it in either the "RESET" state or the "SET" state, and later reading the memory cell to determine which of the two states it is in. In some embodiments, operation of the memory cell may comprise a mechanism in which the reactive electrode is utilized to form a thin layer of hafnium oxide, lanthanum oxide, ruthenium oxide, titanium oxide and/or zirconium oxide in a region of the programmable material directly adjacent such reactive electrode through reaction of metal from the reactive electrode (specifically, hafnium, lanthanum, ruthenium, titanium and/or zirconium) with oxygen of the programmable material. Such thin layer may be modulated during operation of the memory cell to operably switch the memory cell between a low resistance state and a high resistance state. For instance, conductivity through the programmable material may be operably altered as follows. The resistance may be decreased by pulling more oxygen into the thin layer to increase an amount of oxygen vacancies within a metal silicate matrix and/or metal aluminate matrix, and the resistance may be increased by pulling more oxygen from the thin layer into the metal silicate matrix and/or metal aluminate matrix to decrease the amount of oxygen vacancies within such matrices. The possible mechanism of operation of a memory cell through modulation of oxygen vacancies is provided to assist the reader in understanding the embodiments described herein, and is not to limit any of such embodiments except to the extent, if any, that the mechanism is explicitly recited in the claims which follow.

Figure 3:
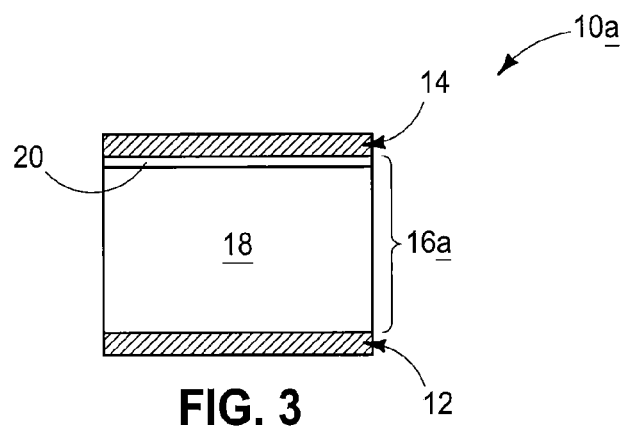

In some embodiments, the thin oxide layer may be provided as part of the programmable material, and accordingly the reactive electrode may be replaced with any suitable conductive material. FIG. 3 shows an example embodiment memory cell 10a having a programmable material 16a comprising an oxide 20 over a composition 18. In some embodiments, the oxide 20 may comprise, consist essentially of, or consist of hafnium oxide, lanthanum oxide, ruthenium oxide, titanium oxide and/or zirconium oxide; and the composition 18 and may include a region having one or both of metal silicate with a ratio of metal to silicon within a range of from about 2 to about 6, and metal aluminate with a ratio of metal to aluminum within a range of from about 2 to about 6. In some embodiments, the oxide 20 may have a thickness of from about 10 Å to about 50 Å. In such embodiments, the composition 18 and may have a thickness of at least about 50 Å, and in some embodiments may have a thickness of at least about 100 Å.

The memory cell 10a of FIG. 3 comprises the first and second electrodes 12 and 14. In some embodiments, the composition 18 may be homogeneous between the electrode 12 and the oxide 20. In other embodiments, the composition may comprise a metal concentration gradient analogous to the various gradients described above with reference to FIG. 1. In yet other embodiments, the material 18 may comprise two or more discrete compositions analogous to embodiments described below with reference to FIGS. 4-7.

Figure 4:
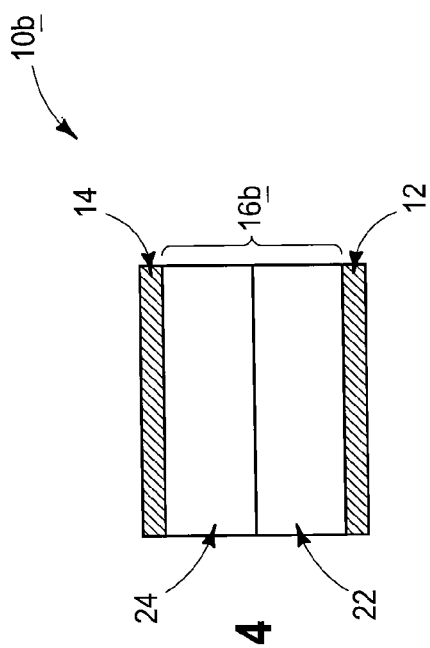

Referring to FIG. 4, a memory cell 10b is shown to comprise a programmable material 16b having two regions 22 and 24, with the regions being of different compositions relative to one another.

In some embodiments, one of the regions 22 and 24 comprises a composition having metal silicate with a ratio of metal to silicon within a range of from about 2 to about 6 and/or having metal aluminate with a ratio of metal to aluminum within a range of from about 2 to about 6. In such embodiments, the other of the regions 22 and 24 may comprise a composition having metal silicate with a ratio of metal to silicon of greater than 6 (and in some embodiments at least about 8) and/or having metal aluminate with a ratio of metal to aluminum of greater than 6 (and in some embodiments at least about 8).

The electrodes 12 and 14 may comprise any suitable materials, and in some embodiments may be a reactive electrode and a nonreactive electrode of the types described above with reference to FIG. 1. For instance, in some embodiments electrode 12 may be a reactive electrode consisting of one or more of hafnium, lanthanum, ruthenium, titanium and zirconium. The region 22 directly adjacent such reactive electrode may comprise a first composition selected from the group consisting of metal silicate with a ratio of metal to silicon within a range of from about 2 to about 6, and metal aluminate with a ratio of metal to aluminum within a range of from about 2 to about 6. For instance, in some embodiments the region 22 may comprise, consist essentially of, or consist of hafnium silicate with a ratio of hafnium to silicon of about 3. The region 24 may comprise a second composition selected from the group consisting of a metal silicate with a ratio of metal to silicon of at least about 6, and a metal aluminate with a ratio of metal to aluminum of at least about 6. For instance, in some embodiments the region 24 may comprise, consist essentially of, or consist of hafnium silicate with a ratio of hafnium to silicon of about 8. The electrode 14 directly against the second region 24 may be a nonreactive electrode, and in some embodiments may comprise, consist essentially of, or consist of a metal nitride.

Figure 5:
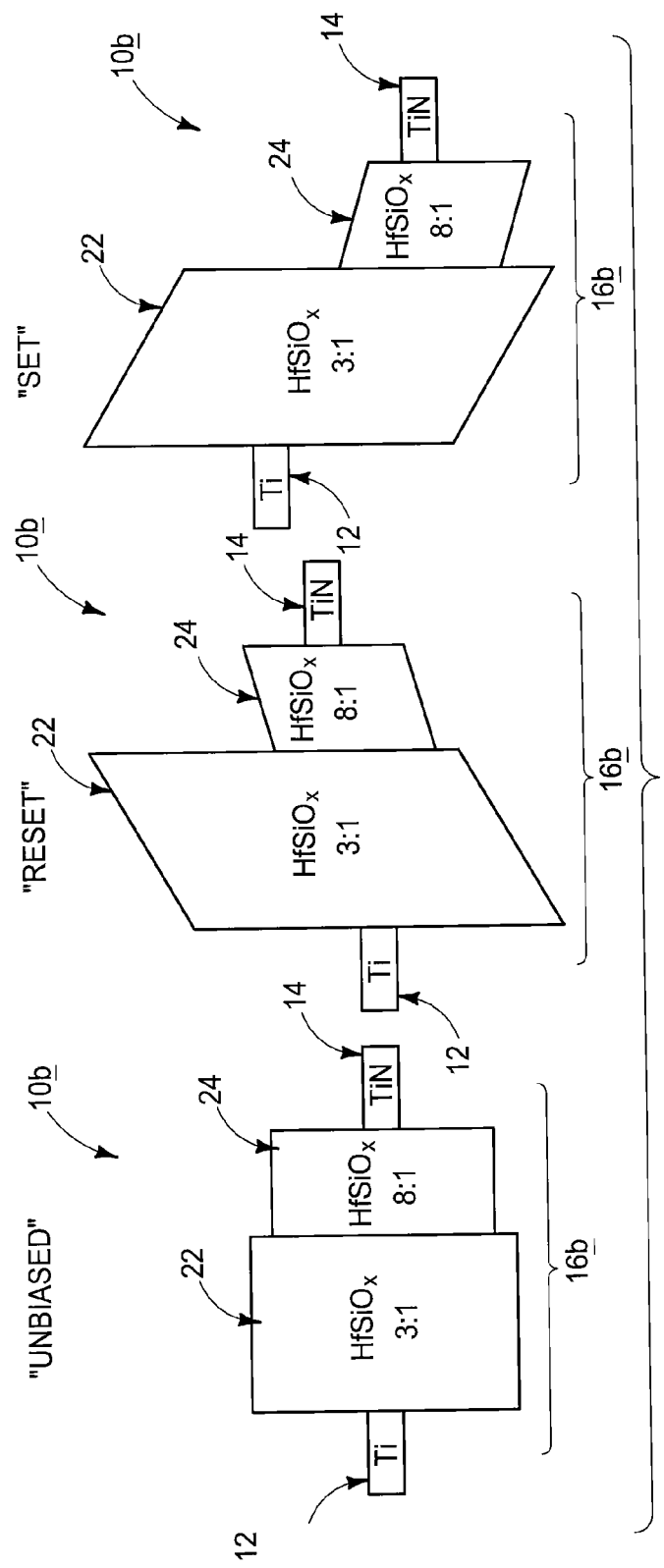
FIG. 5 illustrates example operational states of an example memory cell of the type shown in FIG. 4, utilizing band gap diagrams.

FIG. 5 diagrammatically illustrates a plurality of operational states (a so-called "UNBIASED" state, "RESET" state, and "SET" state) of the FIG. 4 memory cell utilizing band gap diagrams. The example embodiment comprises a first electrode 12 consisting of titanium, a second electrode 14 consisting of titanium nitride, and programmable material 16$b$ comprising a first region 22 consisting of hafnium silicate with the ratio of hafnium to silicon of about 3:1; and comprising a second region 24 consisting of hafnium silicate with the ratio of hafnium to silicon of about 8:1.

In some embodiments, the region 22 may be considered to be a "switching region" where changes occur that lead to the different resistivity between the "RESET" state and the "SET" state. The memory cell of FIG. 5 may be considered to be different than that of FIG. 2 in that the memory cell of FIG. 5 comprises a higher dielectric constant region 24 between the switching region and the nonreactive electrode 14, whereas the memory cell of FIG. 2 has the switching region directly against such nonreactive electrode. The inclusion of the higher dielectric constant region 24 in the embodiment of FIG. 5 may enable a higher field in a memory state of the memory cell (for instance, the "SET" state) as compared to the memory cell of FIG. 2 for a same applied voltage, due to a field distribution between the regions 22 and 24. Utilization of two regions in the embodiment of FIG. 5 is found to improve performance and yield of memory cells relative to the embodiment of FIG. 2.

Although the embodiment of FIGS. 4 and 5 comprises two regions of programmable material between the first and second electrodes 12 and 14, in other embodiments there may be more than two regions of the programmable material between the first and second electrodes. For instance, FIG. 6 shows an example embodiment memory cell 10$c$ having programmable material 16$c$ with three regions 30-32 between the electrodes 12 and 14, and FIG. 7 shows an example embodiment memory cell 10$d$ having programmable material 16$d$ with four regions 40-43 between electrodes 12 and 14.

Figure 6:
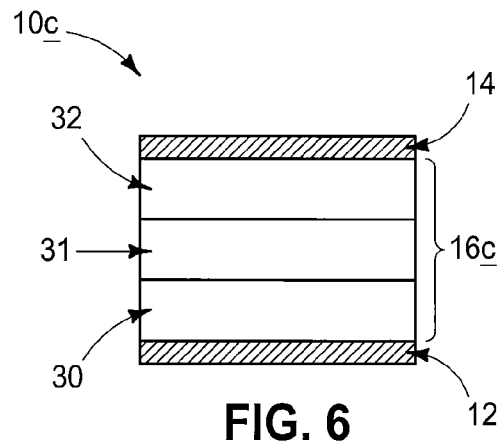

In some embodiments, the regions 30-32 of FIG. 6 may be referred to as first, second and third regions, respectively. Each of the regions may comprise one or both of metal silicate and metal aluminate. In some embodiments, the first and third regions 30 and 32 may comprise compositions selected from the group consisting of metal silicate with a ratio of metal to silicon within a range of from about 2 to about 6, and metal aluminate with a ratio of metal to aluminum within a range of from about 2 to about 6; and the second region 31 may comprise a composition selected from the group consisting of a metal silicate with a ratio of metal to silicon of at least about 6, and a metal aluminate with a ratio of metal to aluminum of at least about 6. The compositions of the first and third regions may be identical to one another in some embodiments, and may be different from one another in other embodiments. The metal within regions 30-32 may comprise one or more of hafnium, lanthanum, ruthenium, titanium and zirconium, in some embodiments. In an example embodiment, the first and third regions 30 and 32 may both consist of hafnium silicate with a ratio of hafnium to silicon of about 3; and the second region 31 may consist of hafnium silicate with a ratio of hafnium to silicon of about 8.

Figure 7:
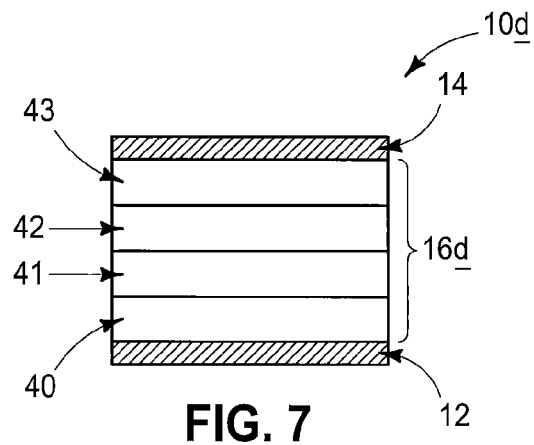

In some embodiments, the regions 40-43 of FIG. 7 may be referred to as first, second, third and fourth regions, respectively. Each of the regions may comprise one or both of metal silicate and metal aluminate. In some embodiments, the first and third regions 40 and 42 may comprise compositions selected from the group consisting of metal silicate with a ratio of metal to silicon within a range of from about 2 to about 6, and metal aluminate with a ratio of metal to aluminum within a range of from about 2 to about 6; and the second and fourth regions 41 and 43 may comprise a composition selected from the group consisting of a metal silicate with a ratio of metal to silicon of at least about 6, and a metal aluminate with a ratio of metal to aluminum of at least about 6. The compositions of the first and third regions may be identical to one another in some embodiments, and may be different from one another in other embodiments. Similarly, the compositions of the second and fourth regions may be identical to one another in some embodiments, and may be different from one another in other embodiments. The metal within regions 40-43 may comprise one or more of hafnium, lanthanum, ruthenium, titanium and zirconium, in some embodiments. In an example embodiment, the first and third regions 40 and 42 may both consist of hafnium silicate with a ratio of hafnium to silicon of about 3; and the second and fourth regions 41 and 43 may both consist of hafnium silicate with a ratio of hafnium to silicon of about 8.

The programmable materials 16$b$-$d$ of FIGS. 4, 6 and 7 may have any suitable thicknesses, and in some embodiments may have thicknesses of at least about 100 Å. In such embodiments, the various regions of the programmable materials may have any suitable thicknesses. For instance, the regions 22 and 24 of FIG. 4 may each have the same thickness as one another in some embodiments, or may have different thicknesses from one another in other embodiments. Analogously, the regions 30-32 of FIG. 6 may have the same thicknesses as one another, or at least one of the regions may have a different thickness than at least one other region; and the regions 40-43 of FIG. 7 may have the same thicknesses as one another, or at least one of the regions may have a different thickness than at least one other region.

The memory cells of FIGS. 1-7 may be formed with any suitable processing. An example embodiment method for forming the memory cell 10 of FIG. 1 is described with reference to FIGS. 8-11. Analogous processing may be utilized for forming other example embodiment memory cells, such as the memory cells of FIGS. 3-7.

Figure 8:
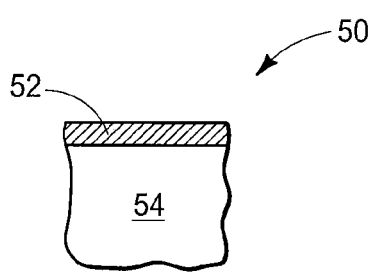
FIGS. 8-11 are diagrammatic cross-sectional views of a construction at various process stages of an example embodiment method which may be utilized for forming memory cells.

Referring to FIG. 8, a semiconductor construction 50 is shown to comprise conductive material 52 over a base 54. The base may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. In some embodiments, the base may correspond to a semiconductor substrate containing one or more materials associated with integrated circuit fabrication. In such embodiments, such materials may correspond to one or more of refractory metal materials, barrier materials, diffusion materials, insulator materials, etc.

The conductive material 52 is ultimately patterned into the first electrode 12 of FIG. 1, and may comprise any of the compositions discussed above regarding such first electrode. The conductive material 52 may be formed utilizing any suitable processing, including, for example, one or more of atomic layer deposition (ALD), chemical vapor deposition (CVD), and physical vapor deposition (PVD).

Figure 9:
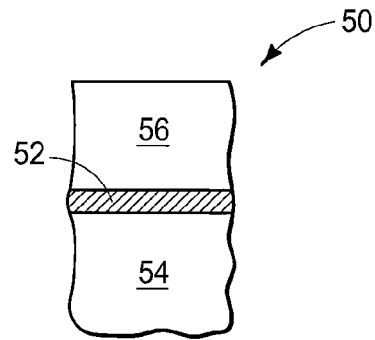

Referring to FIG. 9, programmable material 56 is formed over and directly against the conductive material 52. The programmable material 56 may comprise any of the compositions discussed above regarding programmable material 16 of FIG. 1. The programmable material may be formed utilizing any suitable processing, including, for example, one or more of ALD, CVD and PVD.

Figure 10:
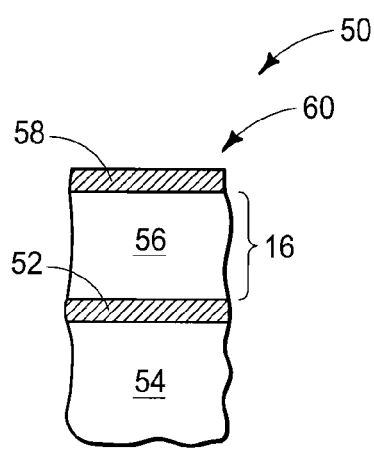

Referring to FIG. 10, a conductive material 58 is formed over the programmable material 56. The material 58 is ultimately patterned into the second electrode 14 of FIG. 1, and may comprise any of the compositions discussed above regarding such second electrode. The conductive material 58 may be formed utilizing any suitable processing, including, for example, one or more of ALD, CVD and PVD. In some embodiments, materials 52 and 58 may be referred to as first and second electrode materials, respectively. The materials 52, 56 and 58 are patterned into a memory cell 60 analogous to the memory cell 10 of FIG. 1. The materials 52, 56 and 58 may be patterned into the memory cell configuration utilizing any suitable processing. The illustrated memory cell may be representative of a plurality of memory cells which are formed as part of an integrated memory array.

Figure 11:
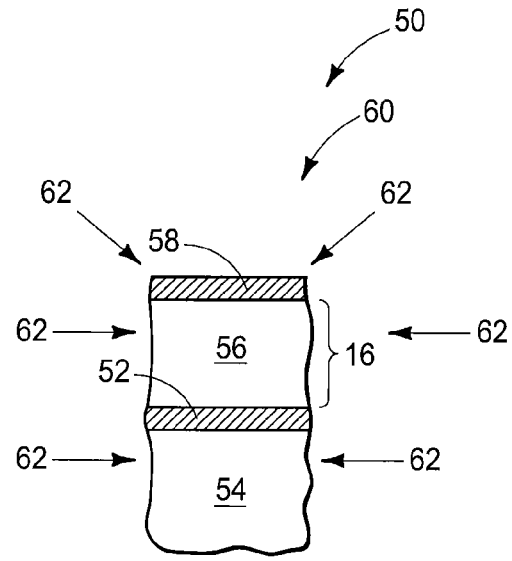

Referring to FIG. 11, the memory cell 60 is annealed at a temperature within a range of from about 300° C. to about 500° C. for a time of from about 1 minute to about 1 hour, (for instance, the anneal may be conducted under conditions which maintain the materials 52, 56 and 58 at a temperature of about 400° C. for a time of about 30 minutes). The anneal is represented by arrows 62 in FIG. 11.

The anneal of FIG. 11 is conducted after formation of electrode material 58. Although the anneal is shown conducted after patterning the materials 52, 56 and 58 into memory cell 60, in other embodiments the anneal may be conducted prior to patterning of one or more of materials 52, 56 and 58 into a memory cell configuration. In some embodiments, the anneal of FIG. 11 is found to improve yield and/or performance of memory cells as compared to analogous memory cells formed with processing lacking such anneal. The performance improvement may include improvement in durability (i.e. lifetime) of memory cells in some embodiments.

The construction 50 may be kept under an inert atmosphere (for instance, $N_2$) during the anneal.

The anneal of FIG. 11 may be utilized for treating any of the memory cell constructions described herein. For instance, such anneal may be utilized for treating a construction of the type shown in FIG. 3 in which programmable material comprises a dielectric material 20 formed over a region 18 comprising one or both of metal silicate and metal aluminate. In such embodiments, the dielectric material may be formed utilizing any suitable processing, including, for example, one or both of ALD and CVD. As another example, such anneal may be utilized for treating constructions of the types shown in FIGS. 4, 6 and 7 in which the forming of the programmable material comprises forming multiple different compositions containing metal aluminate and/or metal silicate.

The memory cells discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory cell having a first electrode, a second electrode, and programmable material between the first and second electrodes. The programmable material comprises a region containing a material selected from the group consisting of a metal silicate with a ratio of metal to silicon within a range of from about 2 to about 6, and a metal aluminate with a ratio of metal to aluminum within a range of from about 2 to about 6.

Some embodiments include a memory cell having a first electrode, a second electrode and programmable material between the first and second electrodes. The programmable material has a first region comprising a material selected from the group consisting of a metal silicate with a ratio of metal to silicon within a range of from about 2 to about 6, and a metal aluminate with a ratio of metal to aluminum within a range of from about 2 to about 6. The programmable material has a second region comprising a material selected from the group consisting of a metal silicate with a ratio of metal to silicon of greater than 6, and a metal aluminate with a ratio of metal to aluminum of greater than 6.

Some embodiments include a memory cell having a first electrode, a second electrode and programmable material between the first and second electrodes. The first electrode consists of metal selected from the group consisting of hafnium, lanthanum, ruthenium, titanium, zirconium, and mixtures thereof. The programmable material has a first region directly against the first electrode and comprising a first composition selected from the group consisting of a metal silicate with a ratio of metal to silicon within a range of from about 2 to about 6, and a metal aluminate with a ratio of metal to aluminum within a range of from about 2 to about 6. The programmable material has a second region directly against the second electrode and comprising a second composition selected from the group consisting of a metal silicate with a ratio of metal to silicon of at least about 6, and a metal aluminate with a ratio of metal to aluminum of at least about 6.

Some embodiments include a method of forming a memory cell. First electrode material is formed over a base, and programmable material is formed over the first electrode material. The programmable material includes a region comprising a composition selected from the group consisting of a metal silicate with a ratio of metal to silicon within a range of from about 2 to about 6, and a metal aluminate with a ratio of metal to aluminum within a range of from about 2 to about 6. Second electrode material is formed over the programmable material. After the second electrode material is formed, the memory cell is annealed at a temperature within a range of from about 300° C. to about 500° C. for a time of from about 1 minute to about 1 hour.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
a first electrode;
a second electrode;
programmable material between the first and second electrodes; the programmable material comprising a region which includes a material selected from the group consisting of a metal silicate with a ratio of metal to silicon within a range of from about 2 to about 6, and a metal aluminate with a ratio of metal to aluminum within a range of from about 2 to about 6; and
wherein the programmable material is a single composition extending from directly against the first electrode to directly against the second electrode.

2. A memory cell, comprising:
a first electrode;
a second electrode;
programmable material between the first and second electrodes; the programmable material comprising a region which includes a material selected from the group consisting of a metal silicate with a ratio of metal to silicon within a range of from about 2 to about 6, and a metal aluminate with a ratio of metal to aluminum within a range of from about 2 to about 6; and
wherein the programmable material comprises a higher concentration of metal adjacent one of the electrodes than in another location within the memory cell.

3. A memory cell, comprising:
a first electrode;
a second electrode;
programmable material between the first and second electrodes; the programmable material comprising a region which includes a material selected from the group consisting of a metal silicate with a ratio of metal to silicon within a range of from about 2 to about 6, and a metal aluminate with a ratio of metal to aluminum within a range of from about 2 to about 6; and
wherein the programmable material further comprises an oxide between one of the electrodes and said region; the oxide having a thickness within a range of from about 10 Å to about 50 Å, and comprising one or more of hafnium oxide, lanthanum oxide, ruthenium oxide, titanium oxide and zirconium oxide.

4. A memory cell, comprising:
a first electrode;
a second electrode;
programmable material between the first and second electrodes; the programmable material comprising a region which includes a material selected from the group consisting of a metal silicate with a ratio of metal to silicon within a range of from about 2 to about 6, and a metal aluminate with a ratio of metal to aluminum within a range of from about 2 to about 6; and
wherein one of the electrodes is a reactive electrode and the other of the electrodes is a nonreactive electrode; and wherein the programmable material comprises a higher concentration of metal adjacent the nonreactive electrode than adjacent the reactive electrode.

5. The memory cell of claim 4 wherein:
the programmable consists essentially of metal silicate; and
the programmable material comprises a region directly against the reactive electrode having a ratio of metal to silicon within a range of from about 3 to about 6.

6. The memory cell of claim 5 wherein the programmable material comprises a region directly against the nonreactive electrode having a ratio of metal to silicon of at least about 8.

7. The memory cell of claim 6 wherein the metal is selected from the group consisting of hafnium, lanthanum, ruthenium, titanium, zirconium, and mixtures thereof.

8. The memory cell of claim 6 wherein the reactive electrode consists essentially of titanium, the programmable material consists essentially of hafnium silicate, and the nonreactive electrode comprises titanium nitride.

9. A memory cell, comprising:
a first electrode;
a second electrode;
programmable material between the first and second electrodes;
the programmable material comprising a first region which includes a material selected from the group consisting of a metal silicate with a ratio of metal to silicon within a range of from about 2 to about 6, and a metal aluminate with a ratio of metal to aluminum within a range of from about 2 to about 6; and
the programmable material comprising a second region comprising a material selected from the group consisting of a metal silicate with a ratio of metal to silicon of greater than 6, and a metal aluminate with a ratio of metal to aluminum of greater than 6.

10. The memory cell of claim 9 wherein the second region comprises a material selected from the group consisting of a metal silicate with a ratio of metal to silicon of at least about 8, and a metal aluminate with a ratio of metal to aluminum of at least about 8.

11. The memory cell of claim 9 wherein the programmable material comprises a third region; and wherein the third region comprises a material selected from the group consisting of a metal silicate with a ratio of metal to silicon within a range of from about 2 to about 6, and a metal aluminate with a ratio of metal to aluminum within a range of from about 2 to about 6.

12. The memory cell of claim 11 wherein the second region is between the first region and the third region.

13. The memory cell of claim 11 wherein the programmable material comprises a fourth region; and wherein the fourth region comprises a material selected from the group consisting of a metal silicate with a ratio of metal to silicon of greater than 6, and a metal aluminate with a ratio of metal to aluminum of greater than 6.

14. The memory cell of claim 13 wherein:
the electrodes are a first electrode and a second electrode;
the first region is adjacent the first electrode;
the second region is between the first region and the third region; and
the fourth region is between the third region and the second electrode.

15. A memory cell, comprising:
a first electrode consisting of an electrode material selected from the group consisting of hafnium, lanthanum, ruthenium, titanium, zirconium, and mixtures thereof;
a second electrode;
programmable material between the first and second electrodes;
the programmable material comprising a first region directly against the first electrode and comprising a first composition selected from the group consisting of a metal silicate with a ratio of metal to silicon within a range of from about 2 to about 6, and a metal aluminate with a ratio of metal to aluminum within a range of from about 2 to about 6; and
the programmable material comprising a second region directly against the second electrode and comprising a second composition selected from the group consisting of a metal silicate with a ratio of metal to silicon of at least about 6, and a metal aluminate with a ratio of metal to aluminum of at least about 6.

16. The memory cell of claim 15 wherein the second electrode comprises a nitride of the electrode material of the first electrode.

17. The memory cell of claim 15 wherein the second composition is selected from the group consisting of a metal silicate with a ratio of metal to silicon of at least about 8, and a metal aluminate with a ratio of metal to aluminum of at least about 8.

* * * * *